(12) United States Patent
Fukuzumi et al.

(10) Patent No.: US 8,878,254 B2
(45) Date of Patent: Nov. 4, 2014

(54) SEMICONDUCTOR MEMORY DEVICE

(71) Applicant: Kabushiki Kaisha Toshiba, Minato-ku (JP)

(72) Inventors: Yoshiaki Fukuzumi, Yokohama (JP); Hideaki Aochi, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/064,380

(22) Filed: Oct. 28, 2013

(65) Prior Publication Data

US 2014/0050032 A1    Feb. 20, 2014

Related U.S. Application Data

(62) Division of application No. 13/046,894, filed on Mar. 14, 2011, now Pat. No. 8,581,305.

(30) Foreign Application Priority Data

Mar. 24, 2010  (JP) .................................. 2010-068136

(51) Int. Cl.
*H01L 27/10* (2006.01)
*G11C 16/04* (2006.01)
*H01L 27/24* (2006.01)
*H01L 23/525* (2006.01)
*G11C 13/00* (2006.01)

(52) U.S. Cl.
CPC ............ *G11C 16/04* (2013.01); *G11C 2213/73* (2013.01); *H01L 27/2436* (2013.01); *H01L 23/525* (2013.01); *G11C 13/0007* (2013.01)

USPC .......................................... 257/209; 257/202

(58) Field of Classification Search
USPC ................................................. 257/209, 202
See application file for complete search history.

(56) References Cited

U.S. PATENT DOCUMENTS 6,259,116 B1    7/2001  Shannon
2006/0071272 A1    4/2006  Alvarado et al.

FOREIGN PATENT DOCUMENTS

JP    2001-506426 A    5/2001
JP    2006-108670      4/2006
JP    2009-81251 A     4/2009

OTHER PUBLICATIONS

Japanese Office Action issued Aug. 14, 2012 in Patent Application No. 2010-068136 with English Translation.

*Primary Examiner* — Long Pham
(74) *Attorney, Agent, or Firm* — Oblon, Spivak, McClelland, Maier & Neustadt, L.L.P.

(57) ABSTRACT

A semiconductor memory device according to one embodiment of the present invention includes a dielectric film configured to store information depending on presence or absence of a conductive path therein, and a plurality of electrodes provided to contact a first surface of the dielectric film. The conductive path can be formed between two electrodes arbitrarily selected form the plurality of electrodes. The conductive path has a rectifying property of allowing a current to flow more easily in a first direction connecting arbitrary two electrodes than in a second direction opposite to the first direction. The largest possible number of the conductive paths that may be formed is larger than the number of the plurality of electrodes.

9 Claims, 9 Drawing Sheets

FIG. 4A WRITE OPERATION
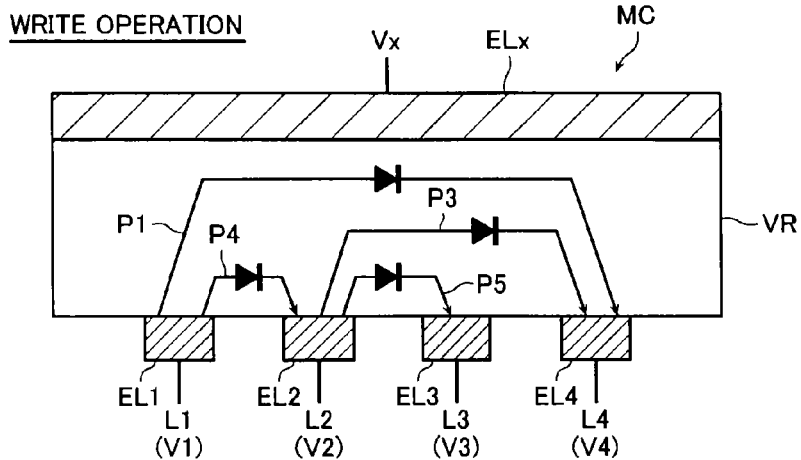
FIG. 4B READ OPERATION
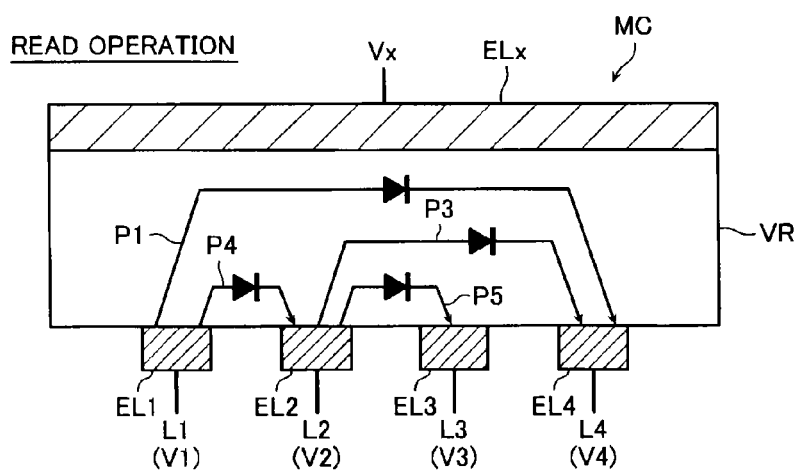
FIG. 4C ERASE OPERATION
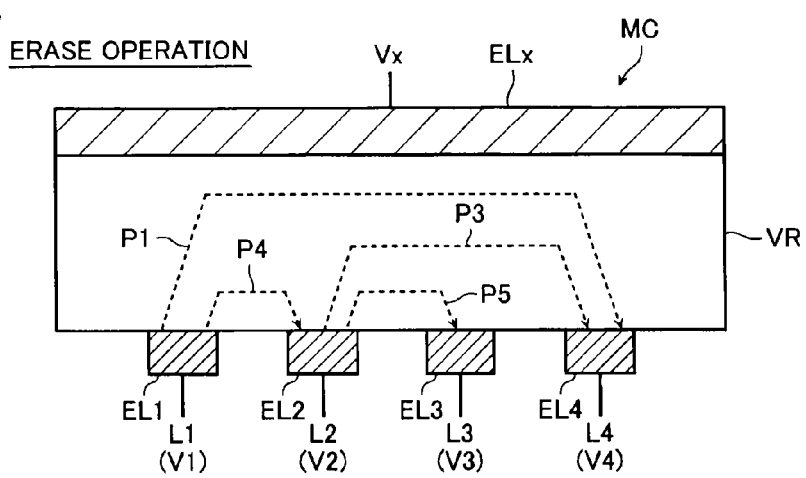

SEMICONDUCTOR MEMORY DEVICE

CROSS REFERENCE TO RELATED APPLICATIONS

This application is a division of and claims the benefit of priority under 35 U.S.C. §120 from U.S. Ser. No. 13/046,894, filed Mar. 14, 2011, and claims the benefit of priority from prior Japanese Patent Application No. 2010-68136, filed on Mar. 24, 2010, the entire contents of which are incorporated herein by reference.

BACKGROUND

1. Field

Embodiments described herein relate generally to a semiconductor memory device.

2. Description of the Related Art

Recently, resistance varying memory device using a variable resistance element as its memory element has been paid attention as a candidate to succeed flash memory. A memory cell of a resistance varying memory device includes a variable resistance material between two electrodes, and the variable resistance material is set to a high resistance state and a low resistance state by control of the polarity of a voltage to be applied, the voltage value, the time for which the voltage is applied, etc.

In order to increase the memory capacity of a resistance varying memory device, there is known a configuration of storing information of two bits or more in one memory cell by connecting three or more electrodes to a memory cell and controlling the resistance state of the variable resistance element minutely. However, a memory element to which three or more electrodes are to be connected will have a complicated connection relationship with the electrodes, making it difficult to increase the number of electrodes. Moreover, there is a problem in increasing the number of electrodes, because this increases the area of a memory cell and hence makes it difficult to increase the memory capacity per unit area.

BRIEF DESCRIPTION OF THE DRAWINGS

FIG. 4A is a diagram explaining an operation of a memory cell of a semiconductor memory device according to an embodiment.

FIG. 4B is a diagram explaining an operation of a memory cell of a semiconductor memory device according to an embodiment.

FIG. 4C is a diagram explaining an operation of a memory cell of a semiconductor memory device according to an embodiment.

DETAILED DESCRIPTION

A semiconductor memory device according to one embodiment of the present invention includes a dielectric film configured to store information depending on presence or absence of a conductive path therein, and a plurality of electrodes provided to contact a first surface of the dielectric film. The conductive path can be formed between two electrodes arbitrarily selected from the plurality of electrodes. The conductive path has a rectifying property of allowing a current to flow more easily in a first direction connecting arbitrary two electrodes than in a second direction opposite to the first direction. The largest possible number of the conductive paths that may be formed is larger than the number of the plurality of electrodes.

A semiconductor memory device according to the embodiments of the present invention will now be explained with reference to the drawings.

First Embodiment

Configuration of Semiconductor Memory Device According to First Embodiment

Figure 1:
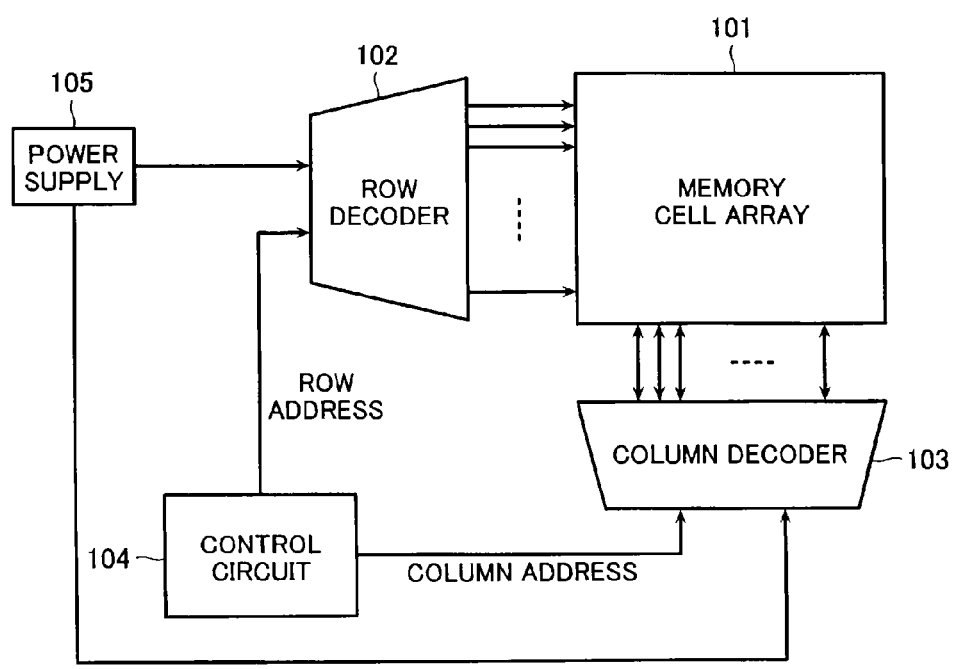
FIG. 1 is a block diagram of a semiconductor memory device according to an embodiment.

FIG. 1 is a block diagram of a semiconductor memory device according to an embodiment of the present invention. The semiconductor memory device includes a memory cell array 101 including a plurality of word lines, a plurality of bit lines intersecting the word lines, and memory cells connected to the word lines and the bit lines. The semiconductor memory device also includes a row decoder 102 configured to select and drive the word lines, a column decoder 103 configured to select and drive the bit lines, and a control circuit 104 configured to supply a row address and a column address to the row decoder 102 and the column decoder 103 respectively. The control circuit 104 selects a memory cell to be read or written from the memory cell array 101 and controls the start and end of an operation on the selected memory cell. A power supply 105 generates a combination of certain voltages which corresponds to each of read, write, and erase operations, and supplies the voltages to the row decoder 102 and the column decoder 103.

Figure 2A:
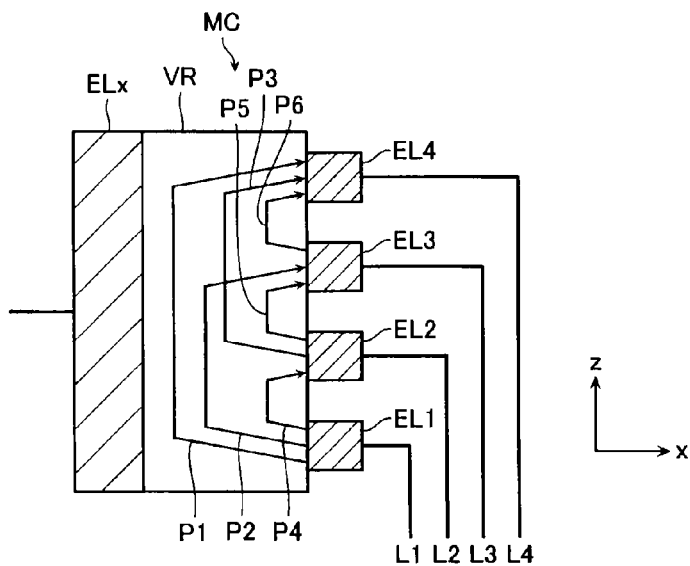
FIG. 2A is a diagram showing a configuration of a memory cell of a semiconductor memory device according to an embodiment.
Figure 2B:
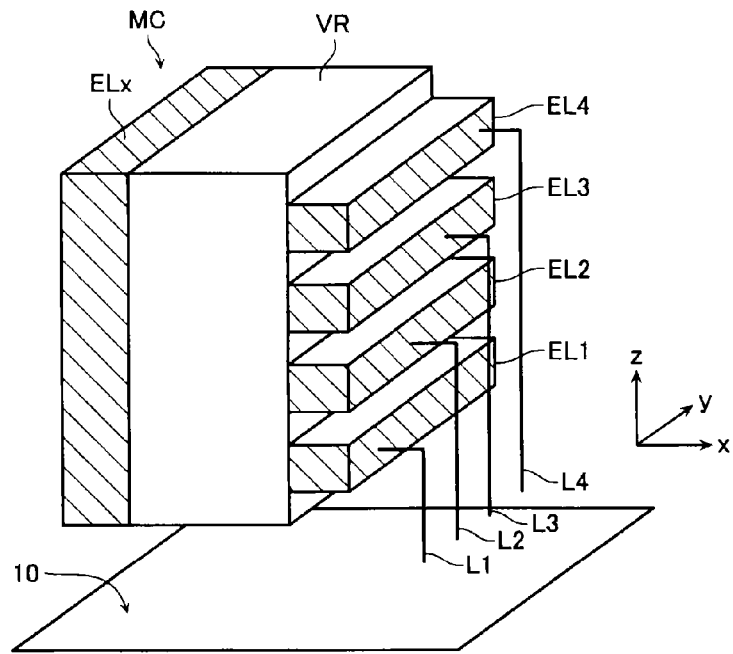
FIG. 2B is a diagram showing a configuration of a memory cell of a semiconductor memory device according to an embodiment.
Figure 3A:
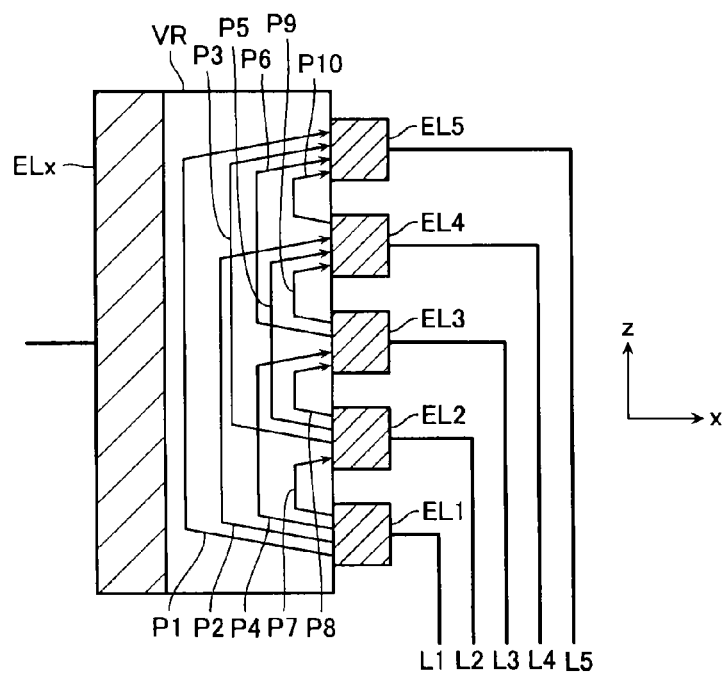
FIG. 3A is a diagram showing a configuration of a memory cell of a semiconductor memory device according to an embodiment.
Figure 3B:
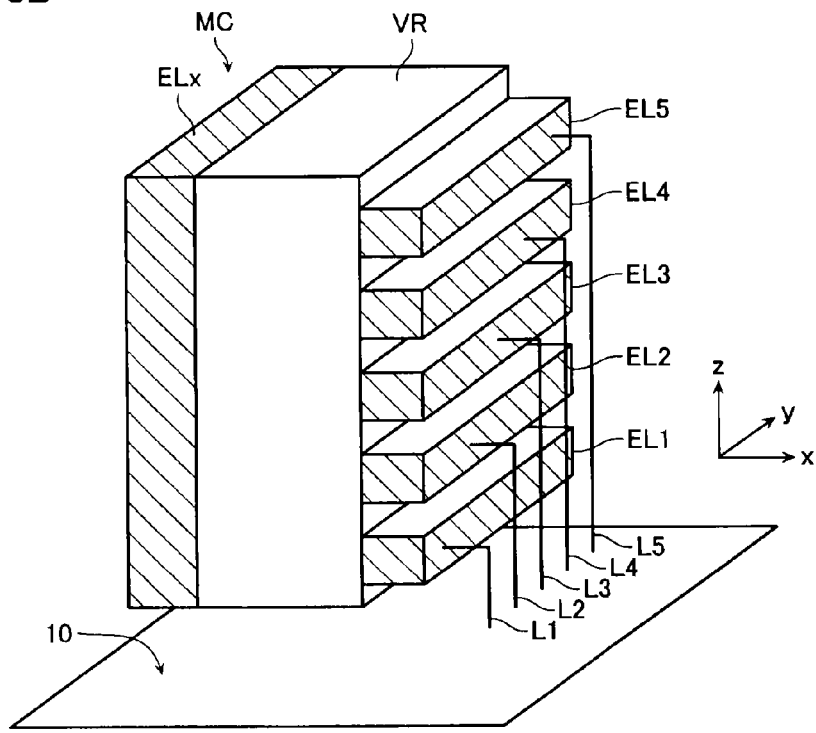
FIG. 3B is a diagram showing a configuration of a memory cell of a semiconductor memory device according to an embodiment.

FIGS. 2A and 2B and FIGS. 3A and 3B are diagrams each showing the configuration of a memory cell MC provided in the memory cell array 101. A memory cell MC is formed on a semiconductor substrate 10 on which the word lines, the bit lines, the control circuit 104 described above, etc. are formed, with, for example, an interlayer insulating film (not shown)

provided between the memory cell MC and the substrate 10. The connection relationship between the word lines, the bit lines, and the memory cell MC provided in the memory cell array 101 will be described in detail later. The memory cell MC includes a dielectric film in which a rectifying conductive path (described later) can be formed. In the following embodiment, a memory cell MC using a variable resistance material as one example of the dielectric film will be explained. The memory cell MC includes a variable resistance material VR, and a plurality of electrodes EL which are provided to contact one side surface of the variable resistance material VR and can be controlled independently regarding the voltages to be applied thereto. FIGS. 2A and 2B show a configuration in which four electrodes EL1 to EL4 are connected to the variable resistance material VR such that they are lined up in a direction (z-direction) perpendicular to the semiconductor substrate 10. FIGS. 3A and 3B show a configuration in which five electrodes EL1 to EL5 are connected to the variable resistance material VR such that they are lined up in a direction (z-direction) perpendicular to the semiconductor substrate 10. As shown in FIG. 2B and FIG. 3B, the electrodes EL can be formed as electrodes stacked with insulating films (not shown) provided therebetween. Lines L1 to L5 are connected to the electrodes EL1 to EL5 respectively, and voltages necessary for operations are applied through the lines L1 to L5. An erasing electrode ELx is provided another side surface of the variable resistance material VR to cover the surface entirely. In the present embodiment, as shown in FIG. 2 and FIG. 3, the erasing electrode ELx is provided to face the plurality of electrodes EL across the variable resistance material VR.

The materials to make the memory cell MC may be, for example, platinum (Pt) for the electrodes EL, titanium dioxide ($TiO_2$) for the variable resistance material VR, and $SrRuO_3$ for the erasing electrode ELx. These materials are mere examples, and other materials can also be used.

The memory cell MC stores information depending on presence or absence of a rectifying conductive path P (for example, a filament that can flow a current only in a certain direction) formed therein. A rectifying conductive path P is formed between arbitrary two electrodes EL among the electrodes EL. When voltages are applied in a manner to apply a certain potential difference between arbitrary two electrodes EL (for example, between the electrode EL1 and the electrode EL4 shown in FIG. 2A), a rectifying conductive path P exhibits a rectifying effect of allowing a current to flow more easily in a first direction than in a second direction opposite to the first direction. For example, when a higher voltage is applied to the electrode EL1 and a lower voltage is applied to the electrode EL4, the rectifying conductive path P can flow a current easily in one direction that connects the two electrodes EL (the direction heading from the electrode EL1 to the electrode EL4). However, when a lower voltage is applied to the electrode EL1 and a higher voltage is applied to the electrode EL4, the rectifying conductive path P exhibits a rectifying effect of allowing only a current on the order of a leakage current to flow in the other direction connecting the two electrodes EL (the direction heading from the electrode EL4 to the electrode EL1).

In the example shown in FIG. 2A, rectifying conductive paths P1 to P6 are formed to flow currents from lower electrodes EL to upper electrodes EL, for example. When there are four electrodes EL1 to EL4, $_4C_2$ patterns, i.e., six patterns of rectifying conductive paths P1 to P6 can be formed among them. When voltages are applied to two electrodes EL (for example, the electrode EL1 and the electrode EL4) such that the lower electrode EL1 becomes a higher potential and the upper electrode EL4 becomes a lower potential, and a current flows as a result of the voltage application, it may be determined that a rectifying conductive path P1 is formed therebetween. In contrast, when no current flows in the same case, it may be determined that a rectifying conductive path P1 is not formed therebetween. One-bit information is stored depending on whether the rectifying conductive path P1 is formed or not. When four electrodes EL are formed in one memory cell MC, six-bit information can be stored.

Also in the example shown in FIG. 3A, rectifying conductive paths P1 to P10 are formed to flow currents from lower electrodes EL to upper electrodes EL. When there are five electrodes EL1 to EL5, $_5C_2$ patterns, i.e., ten patterns of rectifying conductive paths P1 to P10 can be formed, and ten-bit information can be stored. When the number of electrodes EL provided in a memory cell MC is N, the amount of information that can be stored in the memory cell MC is $_NC_2$ (=N(N−1)/2) bits. In this case, when one electrode EL is added, the memory capacity increases in proportion to substantially the second power of N.

Operation of Semiconductor Memory Device
According to First Embodiment

Next, write, read, and erase operations of the memory cell MC configured as described above will be explained with reference to FIG. 4A to FIG. 4C. FIG. 4A to FIG. 4C illustrates the memory cell MC shown in FIG. 2A as having four electrodes EL formed thereon. In FIG. 4A to 4C, the memory cell MC is illustrated. FIG. 4A, FIG. 4B, and FIG. 4C are diagrams explaining a write operation, a read operation, and an erase operation, respectively.

A data write operation of the memory cell MC is executed by applying a voltage Vpgm (>0) to the electrode EL that is to be the starting point of a rectifying conductive path P desired to be formed, and a voltage Vss to the electrode EL that is to be the ending point (see FIG. 4A). The height of a Schottky barrier in the vicinity of the starting-point electrode EL is not substantially changed by this voltage application. However, in the vicinity of the ending-point electrode EL, the height of an inherent Schottky barrier is reduced due to oxygen loss in the variable resistance material VR, changing the junction to an ohmic junction. As a result, a conductive path P (filament) having a rectifying effect is formed between the electrodes EL. When certain voltages are applied across these electrodes EL in the forward direction and reverse direction of the rectifying conductive path P respectively, the current to flow in the forward direction of the rectifying conductive path P is about 0.1 nA to 1 nA, while the current to flow in the reverse direction is 1 pA or lower. Here, in the write operation, the electrodes EL that are not supposed to form a rectifying conductive path P and the erasing electrode ELx are set to a floating state.

For example, when forming a rectifying conductive path P1 between the electrodes EL1 and EL4, the voltages to be applied to the electrodes EL1 to EL4 and ELx are set as follows.

Electrode EL1: voltage V1=Vpgm
Electrode EL2: floating state
Electrode EL3: floating state
Electrode EL4: voltage V4=Vss
Erasing electrode ELx: floating state When forming a rectifying conductive path P3 between the electrodes EL2 and EL4, the voltages to be applied to the electrodes EL1 to EL4 and ELx are set as follows.

Electrode EL1: floating state
Electrode EL2: voltage V2=Vpgm

Electrode EL3: floating state
Electrode EL4: voltage V4=Vss
Erasing electrode ELx: floating state Likewise, when forming a rectifying conductive path P4 between the electrodes EL1 and EL2, the voltages to be applied to the electrodes EL1 to EL4 and ELx are set as follows.

Electrode EL1: voltage V1=Vpgm
Electrode EL2: voltage V2=Vss
Electrode EL3: floating state
Electrode EL4: floating state
Erasing electrode ELx: floating state When forming a rectifying conductive path P5 between the electrodes EL2 and EL3, the voltages to be applied to the electrodes EL1 to EL4 and ELx are set as follows.

Electrode EL1: floating state
Electrode EL2: voltage V2=Vpgm
Electrode EL3: voltage V3=Vss
Electrode EL4: floating state
Erasing electrode EL4: floating state As described above, it is desirable that a rectifying conductive path P is formed in order of decreasing distance of electrodes. As described above, when the voltage Vpgm is applied to the electrode EL2 and the voltage Vss is applied to the electrode EL3 to form the rectifying conductive path P5, potential of the electrode EL4 falls below the voltage Vpgm due to a forward direction voltage drop of the rectifying conductive path P. In this case, the rectifying conductive path P directly connecting the electrode EL3 to EL4 is not formed.

However, when the forward direction voltage drop is small, there is a fear that the rectifying conductive path P is formed at undesirable portion. In this case, erroneous program operation can be prevented by applying an intermediate voltage such as voltage Vpgm/2 to the electrodes located outside of two electrodes that the rectifying conductive path P is to be formed therebetween. In the above example to form the rectifying conductive path P5, only rectifying conductive path P5 can be formed more reliably by applying the voltage Vpgm/2 to the electrode EL1 and EL4, although power consumption increases at the program time.

A rectifying conductive path P can be formed between any other combination of electrodes EL by a similar operation. By such a voltage applying operation as described above, a write operation of a memory cell MC can be executed.

A read operation of a memory cell MC is executed by applying a voltage Vss to one electrode EL and a voltage Vread (>0) to another electrode EL (see FIG. 4B). In this state, whether a rectifying conductive path P is present or absent is determined by monitoring any current flowing through the line L that is connected to the electrode EL applied with the voltage Vread. If a current flows toward the electrode EL applied with the voltage Vss, it is determined that a rectifying conductive path P is present. If no current flows, it is determined that a rectifying conductive path P is absent. Also in the read operation, the erasing electrode ELx is set to a floating state.

Here, by executing a read operation of a memory cell MC in the following procedure, it is possible to reduce the time taken for the read operation. In order to determine whether any rectifying conductive path P whose ending point is the electrode EL4 is present or not, the voltages to be applied to the electrodes EL1 to EL4 and ELx are set as follows.

Electrode EL1: voltage V1=Vread
Electrode EL2: voltage V2=Vread
Electrode EL3: voltage V3=Vread
Electrode EL4: voltage V4=Vss
Erasing electrode ELx: floating state At this time, if rectifying conductive paths P is already formed as shown in FIG. 4B, a current flows from the line L1 to the line L4, and hence the presence of a rectifying conductive path P1 between the electrodes EL1 and EL4 is determined.

A current also flows from the line L2 to the line L4. Here, although the electrode EL2 has also the rectifying conductive paths P4 and P5, no current actually flows through these paths under the above described voltage applying conditions, because the potential differences between the electrodes EL1 and EL2 and between the electrodes EL2 and EL3 are lower than the Schottky barrier. Therefore, whether a current is to flow through the line L2 or not depends on whether a rectifying conductive path P3 is present or absent between the electrodes EL2 and EL4. In the example shown in FIG. 4B, the presence of a rectifying conductive path P3 between the electrodes EL2 and EL4 is determined based on whether a current flows through the line L2.

Absence of a rectifying conductive path P between the electrodes EL3 and EL4 is determined based on the fact that no current flows through the line L3.

Next, in order to determine whether any rectifying conductive path P whose ending point is the electrode EL3 is present or not, the voltages to be applied to the electrodes EL1 to EL4 and ELx are set as follows.

Electrode EL1: voltage V1=Vread
Electrode EL2: voltage V2=Vread
Electrode EL3: voltage V3=Vss
Electrode EL4: voltage V4=Vread
Erasing electrode ELx: floating state If rectifying conductive paths P is already formed as shown in FIG. 4B, a current flows from the line L2 to the line L3, and hence the presence of a rectifying conductive path P5 between the electrodes EL2 and EL3 is determined. At this time, substantially no current flows from the line L2 to the line L4.

No current flows from the line L1 to the line L3, and hence absence of a rectifying conductive path P between the electrodes EL1 and EL3 is determined.

Then, in order to determine whether any rectifying conductive path P whose ending point is the electrode EL2 is present or not, the voltages to be applied to the electrodes EL1 to EL4 and ELx are set as follows.

Electrode EL1: voltage V1=Vread
Electrode EL2: voltage V2=Vss
Electrode EL3: voltage V3=Vread
Electrode EL4: voltage V4=Vread
Erasing electrode ELx: floating state A current flows from the line L1 to the line L2, and hence the presence of a rectifying conductive path P4 between the electrodes EL1 and EL2 is determined. At this time, substantially no current flows from the line L1 to the line L4.

By such a voltage applying operation as described above, it is possible to determine presence or absence of rectifying conductive paths P in the memory cell MC and read information stored in the memory cell MC.

An erase operation of a memory cell MC is executed by applying a voltage Verase (<0V) to the erasing electrode ELx and a voltage Vss to the electrodes EL (see FIG. 4C).

Electrode EL1: voltage V1=Vss
Electrode EL2: voltage V2=Vss
Electrode EL3: voltage V3=Vss
Electrode EL4: voltage V4=Vss
Erasing electrode ELx: voltage Vx=Verase By this voltage application, oxygen loss in the vicinity of the electrodes EL is overcome by oxygen ions supplied from the erasing electrode ELx, shifting the variable resistance material VR to a high resistance state (initial state) in which no rectifying conductive paths P are present. Here, it is preferable to impart an oxygen ion supplying capability to the erasing electrode ELx by using a conductive oxide film or the like such as $SrRuO_3$ mentioned above as the material of the erasing electrode ELx.

The erasing electrode ELx may be provided for each memory cell MC individually, or may be provided as a common electrode for a plurality of memory cells MC to reduce the area of a circuit for controlling the erasing electrode ELx. When the erasing electrode ELx is provided as a common electrode for a plurality of memory cells MC, the erase operation will be on a block basis where one block is configured by a certain number of memory cells MC.

Operations of a memory cell MC having four electrodes EL have thus been described. Write, read, and erase operations of a memory cell MC having five or more electrodes EL can also be executed by similar voltage application.

Effect of Semiconductor Memory Device According to First Embodiment

Figure 5:
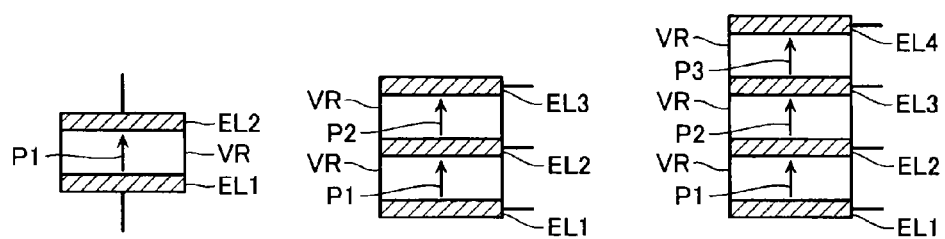
FIG. 5 is a diagram showing a configuration of a memory cell of a semiconductor memory device according to a comparative example.

Next, an effect of the memory cell MC of the semiconductor memory device according to the present embodiment will be explained with reference to memory cells MC of a semiconductor memory device according to a comparative example. FIG. 5 is a diagram showing the configuration of memory cells MC of a semiconductor memory device according to a comparative example.

The memory cell MC shown at the left-hand side of FIG. 5 includes an electrode EL1, a variable resistance material VR, and an electrode EL2 which are stacked in this order. Also, this memory cell MC stores information depending on presence or absence of any rectifying conductive path P therein. In the memory cell MC shown at the left-hand side of FIG. 5, a rectifying conductive path P is formed to flow a current from the lower electrode EL1 to the upper electrode EL2 for example, and the memory cell MC stores one-bit information.

The memory cells MC shown at the middle and the right-hand side of FIG. 5 include more variable resistance materials VR and electrodes EL that are stacked. The memory cell MC shown at the middle of FIG. 5 includes three electrodes EL1, EL2, and EL3 and two variable resistance materials VR provided between these electrodes. The memory cell MC shown at the right-hand side of FIG. 5 includes four electrodes EL1, EL2, EL3, and EL4 and three variable resistance materials VR provided between these electrodes. The memory cells MC shown at the middle and the right-hand side of FIG. 5 store two-bit and three-bit information respectively.

As shown in FIG. 5, when the number of electrodes EL is increased from N to N+1 in the memory cell MC that is configured by simply stacking electrodes EL and variable resistance materials VR, the memory capacity increases only by $N-(N-1)=1$ bit.

In the memory cell MC according to the present embodiment, on the other hand, when the number of electrodes EL provided in the memory cell MC is N, the amount of information that can be stored in the memory cell MC is $_NC_2$ ($=N(N-1)/2$) bits. When one more electrode EL is added to the memory cell MC, the memory capacity increases by $_{(N+1)}C_2 - _NC_2 = N^2$ bits. Therefore, the memory cell MC according to the present embodiment can increase the memory capacity at a rate higher than the rate of increase of the stacking processes, i.e., increase of the number of electrodes EL.

Second Embodiment

Configuration of Semiconductor Memory Device According to Second Embodiment

Figure 6:
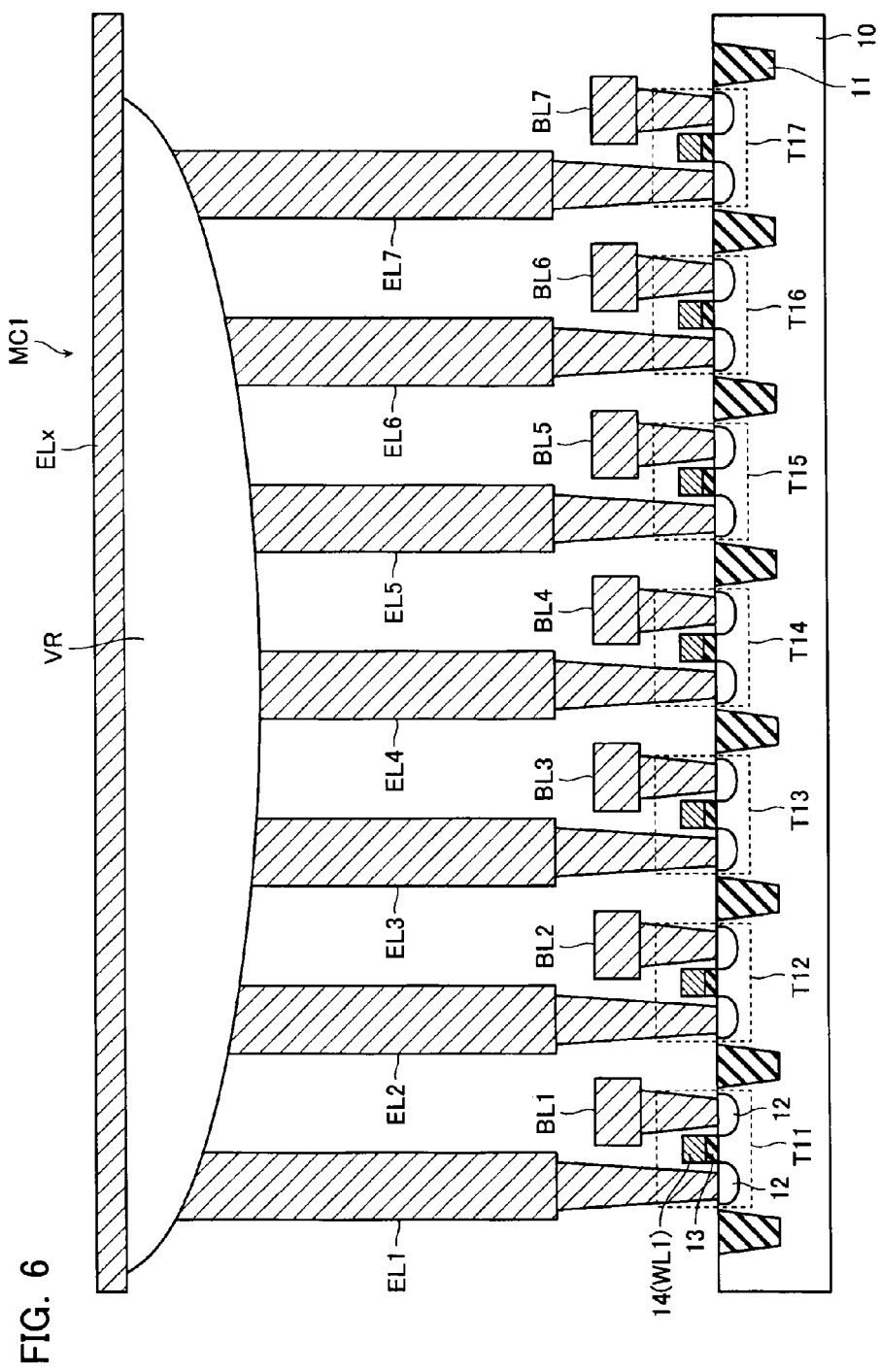
FIG. 6 is a sectional diagram showing a configuration of a memory cell array of a semiconductor memory device according to an embodiment.
Figure 7:
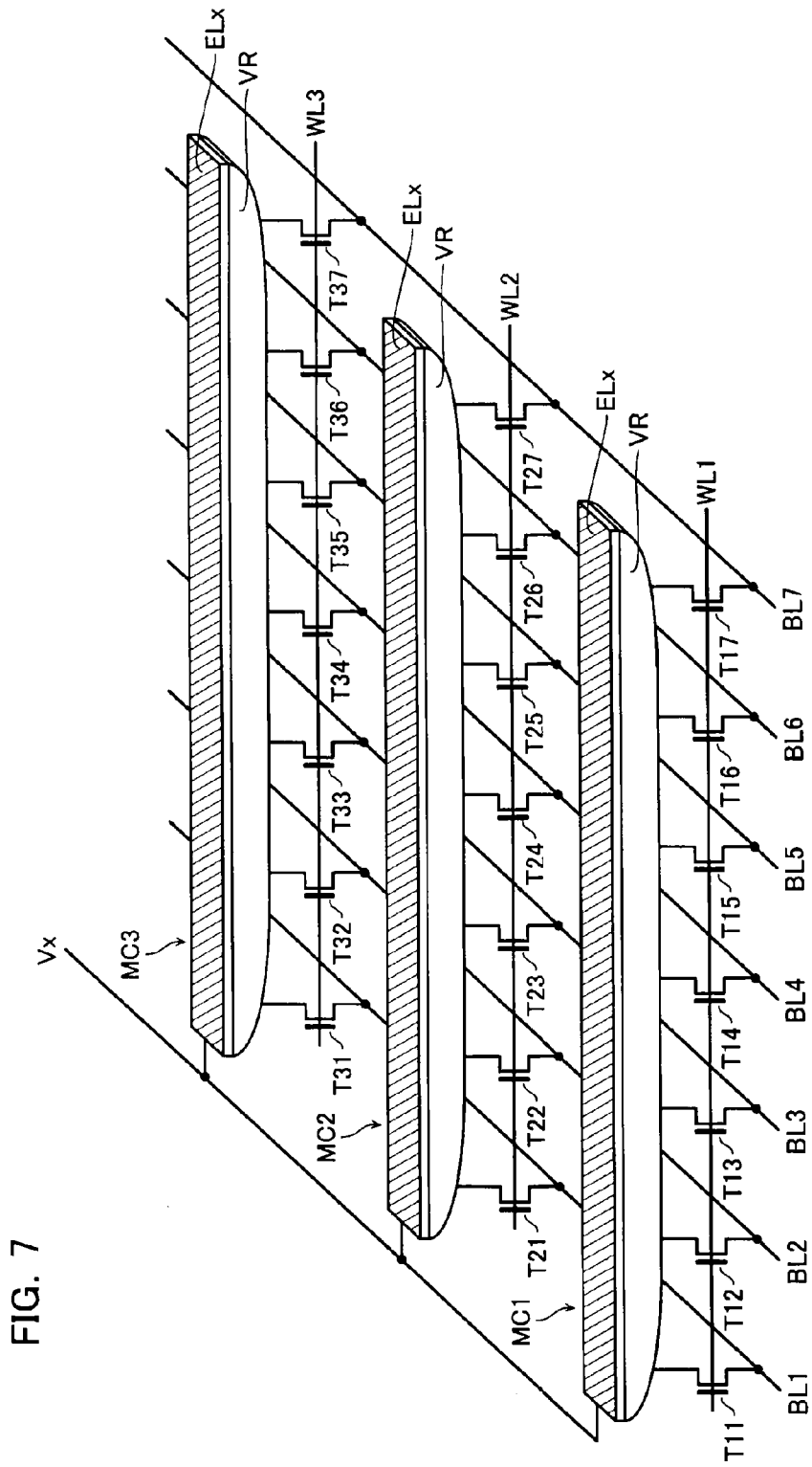
FIG. 7 is an exemplary diagram showing a configuration of a memory cell array of a semiconductor memory device according to an embodiment.

Next, a semiconductor memory device according to a second embodiment of the present invention will be explained. In the second embodiment, the configuration of a memory cell array 101 using the memory cell MC described above will be explained. FIG. 6 is a sectional diagram showing the configuration of a memory cell array 101 of a semiconductor memory device according to the present embodiment. FIG. 7 is an exemplary diagram showing the configuration of the memory cell array 101.

In the first embodiment described above, the configuration example in which four or five electrodes EL are connected to the memory cell MC has been explained. However, in the present embodiment, a configuration example in which seven electrodes EL are connected to the memory cell MC will be explained. Further, in the first embodiment, it has been explained that the electrodes EL of the memory cell MC are stacked in the direction perpendicular to the semiconductor substrate 10. In the present embodiment, the electrodes EL will be explained as being lined up in a direction parallel with the semiconductor substrate 10. In the second embodiment, any portions that have the same configuration as the first embodiment will be denoted by the same reference numerals and redundant explanation will not be given.

As shown in FIG. 6, a plurality of transistors T11 to T17 separated from each other by element separating regions 11 are provided on the semiconductor substrate 10. The transistors T11 to T17 each include a pair of impurity diffused regions 12 formed in the surface of the semiconductor substrate 10, and a gate electrode 14 provided between the impurity diffused regions 12 as insulated by a gate insulating film 13. The gate electrodes 14 of all the transistors T11 to T17 are connected to a word line WL1, and the transistors T11 to T17 become conductive simultaneously when a voltage is applied to the word line WL1. The transistors T11 to T17 have one of the pair of impurity diffused regions 12 thereof connected to bit lines BL1 to BL7 respectively through a via contact. The transistors T11 to T17 have the other of the pair of impurity diffused regions 12 thereof connected to the electrodes EL1 to EL7 respectively through a via contact. The electrodes EL1 to EL7 are connected to a variable resistance material VR configuring a memory cell MC1. In the present embodiment, a cross-sectional surface of the variable resistance material VR has a bowed shape. The electrodes EL1 to EL7 are connected to the arced portion of the variable resistance material VR, which is the bottom surface of the variable resistance material VR having a bowed shape. An erasing electrode ELx is connected to the chordal portion of the variable resistance material VR, which is the top surface of the variable resistance material VR having a bowed shape, such that the erasing electrode ELx covers the chordal portion entirely.

When the side surface of the variable resistance material VR that is contacted by the electrodes EL is planar as shown in the first embodiment, the larger the number of electrodes EL, the more difficult it might become to form a rectifying conductive path P. Hence, the variable resistance material VR may be formed such that its side surface becomes an arc as shown in the present embodiment, and the electrodes EL may be connected to this arced side surface. This enables to securely form a rectifying conductive path P even between electrodes that are separated by a large distance (for example, between the electrode EL1 and the electrode EL7).

A plurality of such memory cells MC as shown in FIG. 6 are provided in the memory cell array 101. FIG. 7 exemplarily shows the configuration of the plurality of memory cells MC, transistors T, bit lines BL, and word lines WL provided in the memory cell array 101. The memory cell MC1 is connected to the bit lines BL1 to BL7 through the transistors T11 to T17. A memory cell MC2 and a memory cell MC 3 are connected to these bit lines BL1 to BL7 through different sets of transistors T21 to T27 and T31 to T37 respectively. The gate electrodes of the transistors T21 to T27 are connected to the word line WL2, and the gate electrodes of the transistors T31 to T37 are connected to the word line WL3. A line for applying an operation voltage Vx is connected to the erasing electrodes of the memory cells MC1 to MC3. The erasing electrodes of the memory cells MC1 to MC3 may be connected to the same line such that their operation is controlled simultaneously, or may be connected to different lines such that their operation is controlled independently.

Operation of Semiconductor Memory Device According to Second Embodiment

When storing information in one memory cell MC of the memory cell array 101 configured as described above, a voltage is applied to the word line WL corresponding to that memory cell MC to make the transistors T conductive. For example, when storing information in the memory cell MC1, a voltage is applied to the word line WL1 to make the transistors T11 to T17 conductive. In this state, a voltage Vpgm (>0) or a voltage Vss is applied to the bit lines BL1 to BL7 to form rectifying conductive paths P in the memory cell MC. The erasing electrode ELx is set to a floating state.

Also in a read operation of the memory cell MC1, a voltage is applied to the word line WL1 to make the transistors T11 to T17 conductive. In this state, a voltage Vss or a voltage Vread (>0) is applied to the bit lines BL1 to BL7. Presence or absence of rectifying conductive paths P is determined by monitoring currents to flow through the bit lines BL. Also in the read operation, the erasing electrode ELx is set to a floating state.

In an erase operation of the memory cell MC1, a voltage is applied to the word line WL1 to make the transistors T11 to T17 conductive, and a voltage Vss is applied to the bit lines BL1 to BL7. In this state, the voltage Vx to be applied to the erasing electrode ELx is set to a voltage Verase to shift the variable resistance material VR to a high resistance state in which no rectifying conductive paths P are present. Here, in the case of a configuration in which the voltage Verase is applied to a plurality of erasing electrodes ELx simultaneously as shown in FIG. 7, a voltage is applied also to the word lines WL2 and WL3 of the memory cells MC2 and MC3 to make the transistors T21 to T27 and T31 to T37 conductive, enabling the erase operation of the memory cells MC2 and MC3 to be executed simultaneously. As a result, information in the plurality of memory cells MC in the memory cell array 101 can be erased simultaneously.

Effect of Semiconductor Memory Device According to Second Embodiment

The amount of information that can be stored in the memory cell MC according to the present embodiment is also $_NC_2 (=N(N-1)/2)$ bits, and the memory capacity increases in proportion to substantially the second power of N when one electrode EL is added. Here, in the present embodiment, seven electrodes EL are connected to one memory cell MC. This memory cell MC can store $_7C_2$ patterns of information (21 bits). It is possible to store approximately three times as large an amount of information as that that can be stored in a cross-point type memory cell array 101 in which memory cells MC each capable of storing one-bit information are arranged at the intersections of bit lines BL and word lines WL.

The memory cell MC according to the present embodiment is connected to the electrodes EL that are lined up in the direction parallel with the semiconductor substrate 10. Therefore, the area occupied by this memory cell MC is larger than the area occupied by the memory cell MC according to the first embodiment that is connected to the electrodes EL that are lined up in the direction perpendicular to the semiconductor substrate 10. However, it becomes unnecessary to repeat stacking and processing steps to form a plurality of electrodes EL, making it easier to manufacture the memory cell array 101. It is possible to select which of the configuration of the memory cell MC according to the first embodiment and the configuration of the memory cell MC according to the second embodiment to employ, by taking into consideration the increase in the stacking and processing difficulty due to addition of electrodes EL and the increase of the memory capacity.

[Others]

Though the embodiments of the present invention have thus been described, the present invention is not limited to these embodiments but various changes, additions, combinations, etc. can be made thereonto within the scope of the spirit of the invention.

Figure 8A:
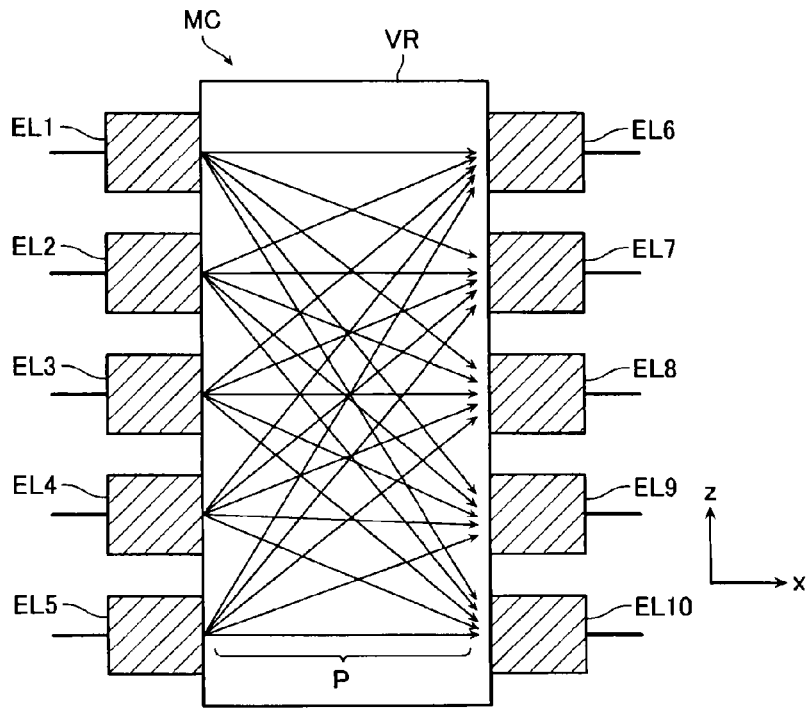
FIG. 8A is a diagram showing a configuration of a memory cell of a semiconductor memory device according to another example.
Figure 8B:
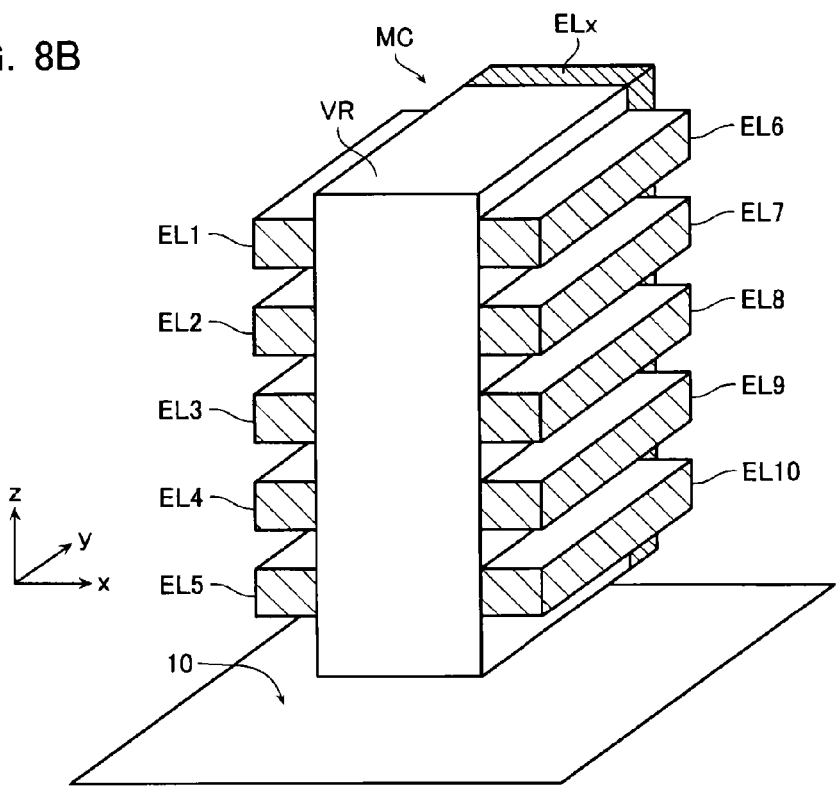
FIG. 8B is a diagram showing a configuration of a memory cell of a semiconductor memory device according to another example.

For example, FIGS. 8A and 8B are diagrams showing another example of a memory cell MC. The memory cell MC shown in FIGS. 8A and 8B includes a variable resistance material VR, electrodes EL1 to EL5 provided to contact one side surface of the variable resistance material VR, and electrodes EL6 to EL10 provided to contact another side surface thereof. Voltages to be applied to the electrodes EL1 to EL10 are controlled independently. FIGS. 8A and 8B show the configuration in which the electrodes EL1 to EL5 and the electrodes EL6 to EL10 are provided on the two facing side surfaces of the variable resistance material VR respectively. The electrodes EL1 to EL10 are connected to the variable resistance material VR to be lined up in a direction (z-direction) perpendicular to the semiconductor substrate 10. An erasing electrode ELx is provided on still another side surface of the variable resistance material VR to cover this surface entirely.

In this memory cell MC, rectifying conductive paths P are formed between the electrodes EL1 to EL5 connected to one side surface and the electrodes EL6 to EL10 connected to another side surface. In the example shown in FIG. 8, 5×5 patterns, i.e., twenty-five patterns of rectifying conductive paths P can be formed between the electrodes EL1 to EL5 and the electrodes EL6 to EL10. When the number of electrodes EL provided on one side surface of the memory cell MC is N and the number of electrodes EL provided on another side surface is M, the amount of information that can be stored in the memory cell MC is M×N bits. In the example shown in FIG. 8, the amount of information that can be stored in the memory cell is $N^2$ bits, and the memory capacity increases in proportion to substantially the second power of N when one pair of electrodes EL are added on the facing side surfaces respectively. The memory capacity of the memory cell MC according to the present example can also be increased by adding electrodes EL on the side surfaces.

Figure 9:
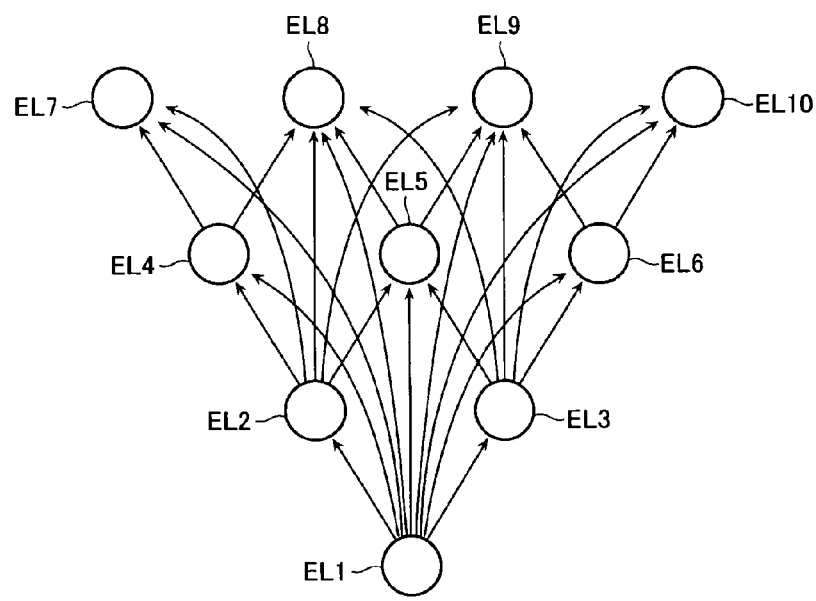
FIG. 9 is a diagram showing a configuration of a memory cell of a semiconductor memory device according a yet another example.

Further, if such a configuration of a memory cell MC, though not to be described in detail, is possible in which the electrodes EL1 to EL10 are connected to the variable resistance material VR stereoscopically and a rectifying conductive path P can be formed between any two of the electrodes, the number of rectifying conductive paths P that may be formed can be further increased, as shown in FIG. 9. This makes it possible to further increase the memory capacity of the memory cell MC.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
   a plurality of first lines provided parallel with one another;
   a plurality of second lines formed to intersect the plurality of first lines;
   a plurality of memory cells, each of the memory cells including a dielectric film, a plurality of first electrodes provided to contact a first surface of the dielectric film, and a second electrode, common to the plurality of first electrodes, provided to contact a second surface of the dielectric film, the first surface being opposite to the second surface; and
   a plurality of transistors connected between one of the first electrodes of the memory cells and one of the plurality of the first lines respectively, gate electrodes of the plurality of transistors being connected to one of the second lines.

2. The semiconductor memory device according to claim 1, further comprising a control circuit configured to execute write, erase, and read operations by applying certain voltages to the plurality of first electrodes and the second electrode,
   wherein the control circuit executes a write operation of forming a conductive path between two electrodes selected from the plurality of first electrodes, by applying voltages to the selected two electrodes through the transistors such that a certain potential difference is applied between the selected two electrodes.

3. The semiconductor memory device according to claim 2, wherein the control circuit executes a read operation of detecting whether a conductive path is formed between the selected two electrodes, by applying voltages to the selected two electrodes through the transistors such that a certain potential difference is applied between the selected two electrodes.

4. The semiconductor memory device according to claim 2, wherein the control circuit executes an erase operation of turning the dielectric film to its initial state by applying a fixed voltage having a first voltage value to the plurality of first electrodes through the transistors and applying an erase voltage having a voltage value smaller than the first voltage value to the second common electrode.

5. The semiconductor memory device according to claim 1, further comprising a control circuit configured to execute write, erase, and read operations by applying certain voltages to the plurality of first electrodes and the second common electrode,
   wherein the control circuit executes a write operation of forming a conductive path in the dielectric film.

6. The semiconductor memory device according to claim 1, wherein the second common electrode extends parallel to the second lines.

7. The semiconductor memory device according to claim 1, wherein the second common electrode is positioned higher than the second lines.

8. The semiconductor memory device according to claim 1, wherein the first lines are positioned higher than the second lines.

9. The semiconductor memory device according to claim 1, wherein the second common electrode is positioned higher than the second lines, and the first lines are positioned higher than the second lines.

* * * * *